(12) United States Patent
Kalil et al.

(10) Patent No.: US 7,735,030 B1
(45) Date of Patent: Jun. 8, 2010

(54) SIMULATING RESTORABLE REGISTERS IN POWER DOMAIN SYSTEMS

(75) Inventors: Nadeem Kalil, Southborough, MA (US);
Philip Giangarra, Medway, MA (US);
Ritesh Goel, Delhi (IN); Tarun Batra,
Delhi (IN)

(73) Assignee: Cadence Design Systems, Inc., San Jose, CA (US)

( * ) Notice: Subject to any disclaimer, the term of this patent is extended or adjusted under 35 U.S.C. 154(b) by 269 days.

(21) Appl. No.: 11/771,888

(22) Filed: Jun. 29, 2007

Related U.S. Application Data

(60) Provisional application No. 60/892,219, filed on Feb. 28, 2007.

(51) Int. Cl.
G06F 17/00 (2006.01)
G06F 17/50 (2006.01)

(52) U.S. Cl. .............................. 716/4; 703/14
(58) Field of Classification Search ............... 716/4; 703/13–14
See application file for complete search history.

(56) References Cited

U.S. PATENT DOCUMENTS

| | | | |
|---|---|---|---|
| 6,779,163 B2 | 8/2004 | Bednar et al. | |
| 6,820,240 B2 * | 11/2004 | Bednar et al. | 716/1 |
| 6,834,331 B1 * | 12/2004 | Liu | 711/156 |
| 6,883,152 B2 * | 4/2005 | Bednar et al. | 716/5 |
| 7,131,099 B2 * | 10/2006 | Schuppe | 716/18 |
| 2004/0243958 A1 * | 12/2004 | Bednar et al. | 716/7 |
| 2005/0108667 A1 * | 5/2005 | Iadanza et al. | 716/4 |
| 2005/0114815 A1 * | 5/2005 | Correale et al. | 716/10 |
| 2006/0129954 A1 * | 6/2006 | Schuppe | 716/4 |
| 2006/0184808 A1 * | 8/2006 | Chua-Eoan et al. | 713/300 |
| 2007/0028193 A1 * | 2/2007 | Correale et al. | 716/1 |
| 2007/0245277 A1 * | 10/2007 | Chen | 716/5 |
| 2008/0276105 A1 * | 11/2008 | Hoberman et al. | 713/300 |

* cited by examiner

*Primary Examiner*—Stacy A Whitmore
(74) *Attorney, Agent, or Firm*—Stephen C. Durant

(57) ABSTRACT

A method of simulating a restorable register in a power domain of an RTL (register transfer level) design includes: specifying the power domain in the RTL design, wherein the power domain includes one or more registers and is configured to change power levels separately from other portions of the RTL design; identifying the restorable register in the power domain, wherein the restorable register is updated during power-on operations in the power domain; simulating the restorable register in a power cycle; and saving one or more values from the simulated restorable register. Simulating the restorable register includes: maintaining one or more backup values during a power-off operation for updating the restorable register after the power-off operation; and updating the restorable register during a power-on operation after the power-off operation by using the one or more backup values.

23 Claims, 9 Drawing Sheets

| Power Domain | Power Mode | | | |
| --- | --- | --- | --- | --- |
| | PM1 | PM2 | PM3 | PM4 |
| PD1 | ON | ON | ON | ON |
| PD2 | ON | OFF | ON | OFF |
| PD3 | ON | ON | OFF | OFF |
| PD4 | ON | ON | ON | OFF |

FIG. 4

| Power Domain | Power Control Signals | | |
| --- | --- | --- | --- |
| | power switch enable (PSE) | isolation cell enable (ICE) | power gating enable (PGE) |
| PD1 | no control signal | no control signal | no control signal |
| PD2 | pse_enable[0] | ice_enable[0] | pge_enable[0] |
| PD3 | pse_enable[1] | ice_enable[1] | pge_enable[1] |
| PD4 | pse_enable[2] | ice_enable[2] | pge_enable[2] |

FIG. 5

```
# Define top design
set_top_design top
# Set up logic structure for all power domains
create_power_domain -name PD1 -default
create_power_domain -name PD2 -instances {inst_A inst_B} \

-shutoff_condition {pm_inst.pse_enable[0]} create_power_domain -name PD3 -instances inst_C \
-shutoff_condition {pm_inst.pse_enable[1]}
create_power_domain -name PD4 -instances inst_D \

-shutoff_condition {pm_inst.pse_enable[2]}
# Define static behavior of all power domains and specify timing constraints
create_power_mode -name PM1 -sdc_files ../SCRIPTS/cm1.sdc \

-activity_file ../SIM/top_1.tcf
create_power_mode -name PM2 -off_domains PD2 -sdc_files ../SCRIPTS/cm2.sdc
create_power_mode -name PM3 -off_domains {PD2 PD3}
create_power_mode -name PM4 -off_domains {PD2 PD3 PD4}
# Set up required isolation and state retention logic of all domains
create_state_retention_logic -restore_edge {pm_inst.pge_enable[0]} \

-instances inst_A.reg_bank_1.out create_state _retention_logic -power_domain PD3 -restore_edge \
{pm_inst.pge_enable[1]}
create_state_retention_logic -power_domain PD4 restore_edge \

{pm_inst.pge_enable[2]} create_isolation_logic -from PD2 -isolation_condition \
{pm_inst.ice_enable[0]} -isolation_output high
create_isolation_logic -from PD3 -isolation_condition \

{pm_inst.ice_enable[1]}
create_isolation_logic -from PD4 -isolation_condition \
{pm_inst.ice_enable[2]}
```

FIG. 6

SIMULATING RESTORABLE REGISTERS IN POWER DOMAIN SYSTEMS

CROSS-REFERENCE TO RELATED APPLICATIONS

This application claims the benefit of U.S. Provisional Application No. 60/892,219, filed Feb. 28, 2007, and incorporated herein by reference in its entirety. The following commonly owned patent applications are expressly incorporated herein by this reference: U.S. Ser. No. 11/489,385, filed Jul. 18, 2006, entitled, SIMULATION OF POWER DOMAIN ISOLATION, invented by Y. Chen; and U.S. Ser. No. 11/489,384, filed Jul. 18, 2006, entitled METHOD AND SYSTEM FOR SIMULATING STATE RETENTION OF AN RTL DESIGN.

BACKGROUND OF THE INVENTION

1. Field of Invention

The present invention relates to designing of integrated circuits and more particularly to simulating the behavior of power domains in the IC design process.

2. Description of Related Art

There is a growing need for enhanced power management capability in electronic devices, especially in battery-operated portable wireless devices such as cell phones, for example. Power management typically involves minimizing overall power consumption among different device functions. The intricacies of power management increase with the number and complexity of device functions.

Power management capabilities typically are built into a circuit design. Techniques to design-in power consumption management in an integrated circuit (IC) design include minimization of leakage power dissipation, design of efficient packaging and cooling systems and verification of functionality or power shut-off sequences early in the IC design process. Efficient power consumption may become an integrated circuit design criterion that is almost as critical as timing and area, particularly for portable consumer electronics, for example.

Modern electronic design typically is performed with computer aided design (CAD) tools or electronic design automation (EDA) systems. To design an integrated circuit, a designer first creates a high level behavior description of an IC device using a high-level hardware design language (HDL). Typically, an HDL is used to express a register transfer level (RTL) description of a design that describes a circuit in terms of a sequence of transfers of data. The word 'register' refers to the fact that in a circuit undergoing design, such transfers ultimately will occur between storage elements such as registers, for example. VHDL and Verilog, are examples of some of the more popular HDLs. An RTL description, for instance, may describe a circuit as a collection of registers, Boolean equations, control logic such as "if-then-else" statements as well as complex event sequences. An RTL description may describe functionality of a set of interconnected modules of varied complexity, from simple logic gates to full blown multipliers, for example. An RTL specification provides instructions to EDA systems, for example, to produce a gate-level netlist and then, through additional design implementation stages, a physical design. The design process typically involves both functional design and verification and physical design and verification.

In the past, power optimization techniques typically have been applied at the physical implementation phase of the design. Certain advanced power management techniques such as multiple power domains with power shut-off (PSO) methodology ordinarily have been implemented at the physical level (i.e., post synthesis). These advanced power management design techniques can significantly influence the design intent. Yet, ordinarily, intended power management behavior is not readily captured in an RTL description of a circuit design. This can result in a gap in the RTL to Graphic Design System II (GDSII) implementation and verification flow where the original RTL is no longer reliable and cannot be used to verify the final netlist implementation containing the advanced power management techniques. In other words, if an RTL description does not adequately encompass power management requirements, it is not readily feasible to check a final netlist against its original corresponding RTL design, since the addition of power management circuitry, during physical implementation, for example, may change the design in ways that make the RTL description an unreliable indicator of whether the final netlist actually comports with original design intent.

In addition, these specialized power management techniques at the physical implementation stage generally cannot be used by EDA tools at other stages of the design process, and therefore, cannot be used by EDA tools at an earlier RTL or gate level stage of the IC design process to perform, for example, functional verification. One reason this is important is that verification of low power designs only at the physical implementation stage of the design process may not capture all potential design flaws within the IC, particularly potential sequence-related problems for power modes that would be more aptly tested at a functional stage of the IC design process.

Furthermore, incorporation of power shut off capability into a functional design as a power saving mechanism, for example, can influence functional behavior of a circuit design. For instance, an original design expressed in an HDL implicitly assumes an uninterrupted source of power. However, the addition of a power-shut-off capability to select portions of a design may undermine that assumption since the shut-off of power in one part of a circuit design may impact the function of other portions of the design With the ever increasing demands for low power electronics, design and verification EDA tools have attempted to include power in their design and verification offerings. However, the concept of power is not an intrinsic part of the underlying semantics of Hardware Description Languages (HDL) such as Verilog and VHDL. This can cause discrepencies between the modeled behaviour and the corresponding behaviour of real hardware. In particular, simulating the behavior of register values in power domain systems may be inaccurate if the effects of power cycling (e.g., register corruption) are not adequately handled. Thus, there is a need for improved simulations for power domain systems.

SUMMARY OF THE INVENTION

In one embodiment of the present invention, a method of simulating a restorable register in a power domain of an RTL (register transfer level) design includes: specifying the power domain in the RTL design, wherein the power domain includes one or more registers and is configured to change power levels separately from other portions of the RTL design; identifying the restorable register in the power domain, wherein the restorable register is updated during power-on operations in the power domain; simulating the restorable register in a power cycle; and saving one or more values from the simulated restorable register. Simulating the restorable register includes: maintaining one or more backup values during a power-off operation for updating the restorable register after the power-off operation; and updating the restorable register during a power-on operation after the power-off operation by using the one or more backup values.

According to one aspect of this embodiment, the restorable register may be a combinational register that depends directly on one or more primary inputs for the power domain; and maintaining the one or more backup value may include monitoring the one or more primary inputs for changing values. Additionally, with respect to this aspect, simulating the restorable register may further include updating a shadow register for the restorable register in response to a change in the one or more primary inputs; and updating the restorable register includes accessing the shadow register.

According to another aspect, the restorable register may be a constant register whose value is maintained as a backup value in a memory element; and updating the restorable register may include accessing the memory element.

According to another aspect, identifying the restorable register in the power domain may include: identifying one or more combinational registers in the power domain and evaluating dependencies for the one or more combinational registers to determine which of the one or more combinational registers depend directly on one or more primary inputs and require updating during power-on operations.

According to another aspect, identifying the restorable register in the power domain may includes: evaluating dependencies for a plurality of registers in the power domain to determine which registers hold constant values and require updating during power-on operations.

According to another aspect, simulating the restorable register may further include: corrupting the restorable register during the power-off operation.

Additional embodiments relate to an apparatus for carrying out any one of the above-described methods, where the apparatus includes a computer for executing instructions related to the method. For example, the computer may include a processor with memory for executing at least some of the instructions. Additionally or alternatively the computer may include circuitry or other specialized hardware for executing at least some of the instructions. Additional embodiments also relate to a computer-readable medium that stores (e.g., tangibly embodies) a computer program for carrying out any one of the above-described methods with a computer. In these ways the present invention enables improved simulations for power domain systems.

BRIEF DESCRIPTION OF THE DRAWINGS

FIG. 4 shows exemplary power modes in connection with the block diagram shown in FIG. 3.

FIG. 5 shows exemplary power control signals in connection with the block diagram shown in FIG. 3.

FIG. 6 shows exemplary CPF (common power format) code in connection with the block diagram shown in FIG. 3.

DETAILED DESCRIPTION OF EXEMPLARY EMBODIMENTS

Figure 1:
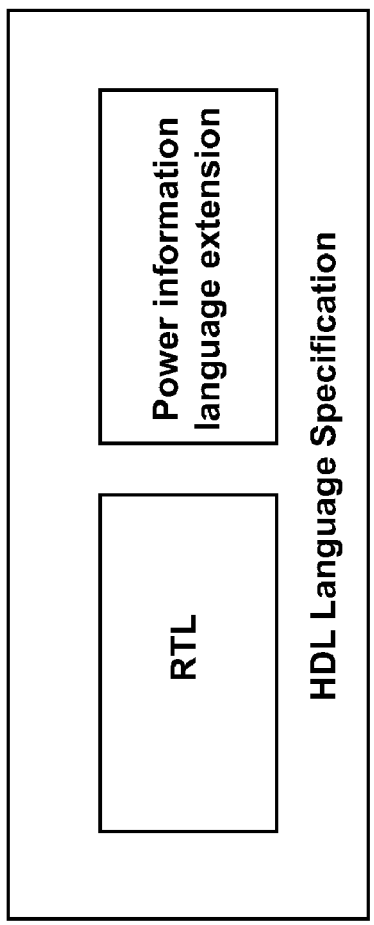
FIG. 1 shows an illustrative drawing representing a power information file in a format implemented as a language extension for an HDL in accordance with some embodiments of the present invention.

The following description is presented to enable any person skilled in the art to make and use a method and apparatus to incorporate power control circuitry design information in a high level circuit design and to use that information at different stages of a circuit design process, in accordance with embodiments of the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and processes are shown in block diagram form in order not to obscure the description of the invention with unnecessary detail. Thus, the present invention is not intended to be limited to the embodiments shown, but is to be accorded the widest scope consistent with the principles and features disclosed herein.

1. Overview of Power-Related Information Specified in Relation to an HDL Description of an Integrated Circuit Design In accordance with some embodiments of the invention, a power information file format, sometimes referred to as a "common power format" (CPF), is used to capture power-related design information such as one or more of, power-related design intent information, power-related power constraints, or power-related technology information for an integrated circuit design. A power information file format may be integrated into an existing HDL, or may be maintained as a separate file. The file format may be accessed and used by EDA tools throughout an EDA flow to design and verify the integrated circuit design. In other words, in some embodiments, an entire design flow including stages such as, verification, validation, synthesis, test, physical synthesis, routing, analysis and signoff, can reference and utilize power-related design information provided in a common power format.

Power-related design intent information is a category of information that identifies the power-related design intent for different portions of the IC design. Different portions of the design having similar intended attributes can be collected together into groupings called "power domains." In some embodiment, each power domain can be individually managed to achieve power management goals established for that power domain. Examples of such management techniques that can be applied to a power domain include the ability to power up or down a particular power domain as a group or specification of a given voltage level for the design blocks within a power domain.

Further, design intent information may include different power-related operating characteristics of the design portions within the IC design. For example, there may be many different intended modes of operation for the IC design, with each mode of operation having a different set of power-related characteristics. For instance, consider an IC design having three power domains, PD_a, PD_b, and PD_c. In a first mode of operation all three power domains may be active, for example. In a second mode of operation, power domain PD_a may be switched off or asleep to save power, but the other two power domains PD_b and PD_c are both active. In a third mode of operation, both PD_a and PD_b may be active, but PD_c may be shut off. As is evident, there may be many variations of operating characteristics for the different power modes. For example, there may be different power-related sequences of operations for the IC design, in which different on/off sequences exist for the different power modes.

Power-related constraint information is a category of information that provides directives to guide optimization and analysis of the IC design. Examples of such power-related constraint information include:

Dynamic or leakage power constraints, e.g., maximum threshold dynamic or leakage at chip or module levels.

IR drop limit constraints, e.g., maximum IR drop limit for a power switch.

Electromigration (EM) constraints, e.g., maximum EM thresholds.

Saturation current constraints, e.g., saturation current limits for a power switch.

Leakage current constraints, e.g., leakage current for a power switch.

Timing constraints, e.g., elapsed time or cycle time constraints to power up or down or timing constraints for multi-mode and multi-corner analysis (for at least three cases: (i) single mode, single corner; (ii) multi-mode, single corner, (iii) multi-mode, multi-corner).

Power-related technology information generally comprises a library of technology and design blocks to represent specific devices that may be used to implement the IC design. In some embodiments, the technology design library includes a library of technology for implementing power-related IC designs. The following are examples of library cells that can be used in some embodiments of the invention:

An always on cell typically comprises a buffer or latch or flop located in a powered down domain, and whose power supply is continuously on even when the power supply for the rest of the logic in the power domain is off.

An isolation cell comprises logic ordinarily used to isolate signals between two power domains when one is powered on and one is powered down. The most common use of such a cell is to isolate signals originating in a power domain that is being powered down, from the power domain that receives these signals and that remains powered on.

A level shifter cell comprises logic to pass data signals between power domains operating at different voltages.

A power switch cell comprises logic used to selectively connect and disconnect a power supply from gates in a power domain.

A state retention cell comprises circuitry such as a flip-flop or latch used to retain the state of the cell when its main power supply is shut off.

Figure 2:
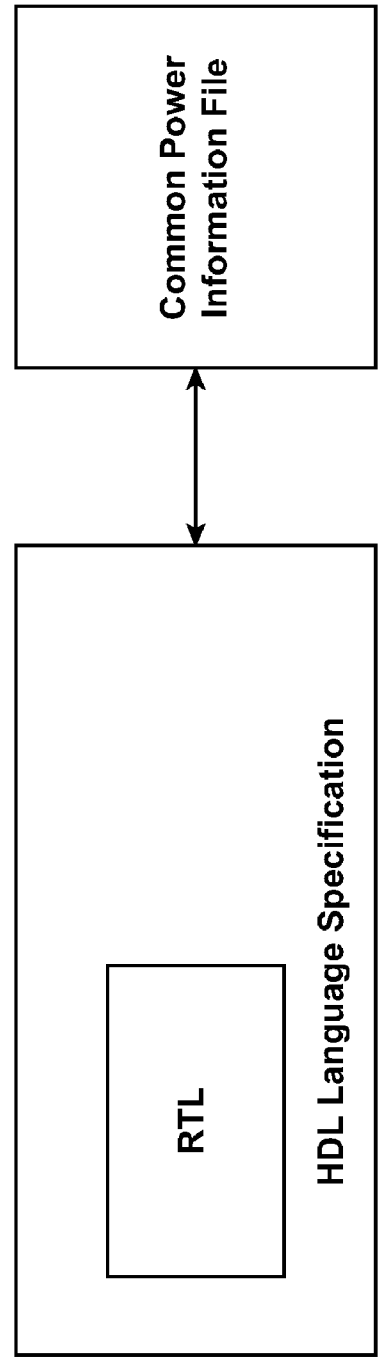
FIG. 2 shows an illustrative drawing representing a power information file in a format implemented separate from a corresponding HDL file format in accordance with some embodiments of the present invention.

There are numerous ways to implement a power information file format to express power-related design information at RTL. FIG. 1 is an illustrative drawing representing a file format implemented as a language extension for an HDL. In this approach, language constructs pertaining to power-related information are added to extend the base functionality of an HDL such as Verilog or VHDL, for example. FIG. 2 is an illustrative drawing representing a power information file format implemented as a file format separate from an HDL file format. As such, the power information is contained in a separate file from the HDL file.

RTL power-related design information in accordance with embodiments of the invention can be used to support the ability to specify that certain portions of a circuit can be individually powered on or off separately from other portions of the circuit. One reason for such power shut-off behavior is to minimize leakage power by making sure that portions of the design that are not needed at any given moment in time can be shut down.

In addition, the RTL power-related information can be used to specify that certain portions of an IC design operate at different voltage levels relative to other portions of the design. In this way, non-critical blocks or design blocks that do not require higher voltage can be implemented at lower voltage levels, thereby minimizing dynamic power consumed by an IC.

Power-related information provided in accordance with some embodiments of the invention is provided in a format that supports specification of multiple power domains, with each power domain potentially having different operating characteristics and voltage levels from other power domains. Power domains at different voltage levels can be tied to different voltage rails. Level shifters can be specified to shift voltage levels up or down between different power domains that are at different voltage levels. Different power modes can be configured that specify which power domains are active and which are inactive under various different conditions. A switch can be specified to turn on or off the flow of power to a particular power domain. Multiple power modes can be configured to provide numerous variations in the different combinations of power domains that are on or off at any given moment in time. Transition information can be specified to identify the conditions under which one power mode changes to another power mode. Transitions may be specified using Boolean expressions. Sequence information may be used to identify the order of legal or valid transitions.

In some embodiments, a power information file format can be implemented hierarchically. For example, different design teams can contribute to different blocks in the design. These blocks, whether they are soft blocks or hard blocks (such as IP instances, where the internal details of the block are unknown) can each have their own power information files.

Figure 3:
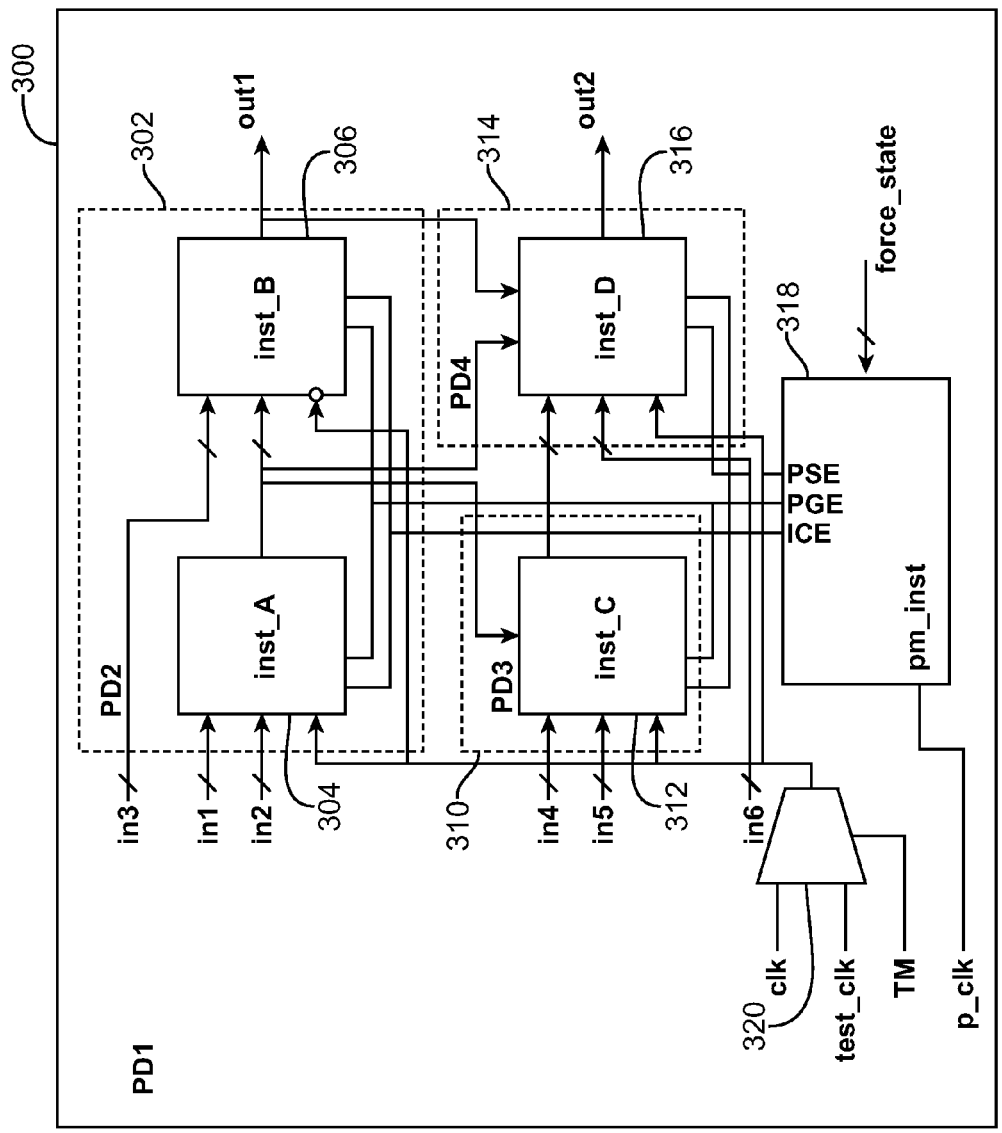
FIG. 3 shows an illustrative block diagram representation of a first example design that implements power-related design information according to some embodiments of the present invention.

FIG. 3 is an illustrative block diagram representation of a first example design that implements power-related design information according to some embodiments of the invention. This example top-level design 300 (also referred to as "top design") includes four logic function instances inst_A 304, inst_B 306, inst_C 312, and inst_D 316, a power manager instance pm_inst 318, and a clock gating logic 320. The term "instance" is used to denote a discrete portion of an overall RTL design. An instance may include one or more behaviors, operations or sets of operations at the RTL abstraction level or one or more logic gates or macros at a logic abstraction level. The term "function" is used to denote that the instance is part of the functional behavior specified by the RTL dosing, as contrasted with power control behavior. In this example, each function instance includes a set of input and output signals. The clock gating logic 320 receives inputs clk and test_clk, and a control signal TM. The output of the clock gating logic controls the gating of the clocks to instances inst_A 304, inst_B 306, inst_C 312, and inst_D 316, respectively.

As shown in FIG. 3, the example design includes four power domains. Individual power domains are defined relative to the function instances encompassed by such individual power domains. The "top design" and the power manager instance pm_inst 318 belong to the default power domain PD1 300. Function instances inst_A 304 and inst_B 306 belong to the power domain PD2 302. Function instance inst_C 312 belongs to power domain PD3 310. Function instance inst_D 316 belongs to power domain PD4 3X. FIG. 4 shows illustrative static behavior of the example design, where four power modes (PM1, PM2, PM3, PM4) are illustrated for the four power domains (PD1, PD2, PD3, PD4).

The power manager instance (pm_inst) 318 generates three sets of power control signals, namely pse_enable, pge_enable, and ice_enable, to control each power domain. FIG. 5 shows illustrative power control signals of the power manager instance pm_inst 318 for controlling the four power domains of the example design.

FIG. 6 shows an example RTL power-related information file listing for the "top design" of FIG. 3 presented in a common power format (CPF) in accordance with some embodiments of the invention. The power-related information listing is encoded in computer readable storage that can be accessed by EDA tools involved with simulation, verification, synthesis and/or physical design, for example. The encoding set forth in FIG. 6 comprises an information structure that corresponds to the power-related design of FIG. 3. The encoding specifies power domains in relation to function instances (i.e. inst_A, inst_B, inst_C and inst_D) from an RTL design specification (not shown). The encoding also specifies power-control related behavior such, as PSO switching, isolation, state retention and always-on, in relation to the specified power domains. Thus, the encoding of FIG. 6 represents an information structure that specifies what parts of an RTL design fit within what power domains and that also specifies power-control related behavior associated with the different power domains specified by the information structure.

Figure 7:
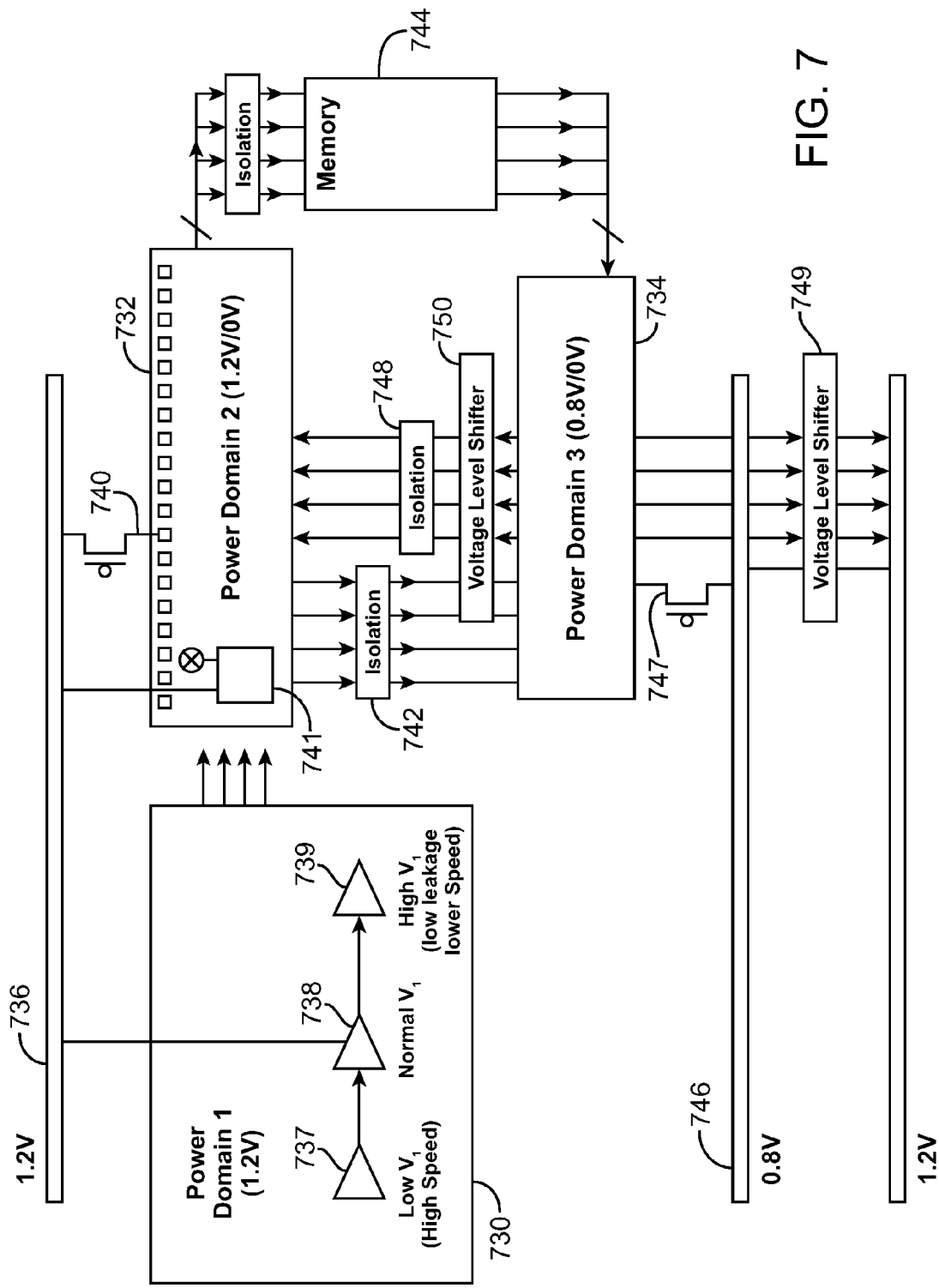
FIG. 7 shows an illustrative block diagram representation of a second example design that implements power-related design information according to some embodiments of the present invention.

FIG. 7 is an illustrative block diagram representation of a second example design that implements power-related design information according to some embodiments of the invention. Power-related information incorporated into an RTL power information format can be in is used to track and maintain the power-related design intent, power-related power constraint, and power-related technology information for this design. This second example design shows characteristics of advanced power management techniques which can be specified using an RTL power information format. Three power domains are shown: Power Domain 1 (730), Power Domain 2 (732), and Power Domain 3 (734).

Power Domain 1 (730) includes a collection of logic blocks (i.e. function instances) that use the same power supply during normal operation. In this example, Power Domain 1 operates at 1.2V. Power Domain 1 is coupled to a power rail 736 operating at 1.2V. It is noted that a switch is not used to couple Power Domain 1 to the 1.2V power rail. As a result, Power Domain 1 is always "on," and cannot be turned off.

Power Domain 1 includes three cells (i.e. function instances) having different operating parameters. A first cell 737 is associated with a low Vt, which provides operating characteristics of high speed and high leakage. A second cell 738 is associated with a normal Vt, which provides operating characteristics of normal speed and normal leakage. A third cell 739 is associated with a low Vt, which provides operating characteristics of low speed but also low leakage. Designers will attempt to balance the selection of these combinations of cells to achieve a desired set of performance characteristics with minimum leakage.

Power Domain 2 (732) also includes a set of logic blocks. Power Domain 2 can be powered on or off depending upon the particular power mode that is being employed. Therefore, Power Domain 1 can be at either 1.2V or 0V. In this example, a power gating switch 740 is used to power off or on the power domain.

Power Domain 2 contains a state retention power gating (SRPG) cell 741 to maintain state information during the periods of time in which the power domain is powered down. It can be seen that the SRPG cell 741 is separately coupled to the 1.2V power rail so that it can retain state even when the power switch has cut off power generally to the power domain.

Power Domain 2 is associated with appropriate isolation logic to ensure that inadvertent and unintended data is not propagated to other blocks when the power domain is powered down. For example, isolation logic 742 is used to connect Power Domain 2 to Power Domain 3. Similarly, isolation logic 743 is used to connect Power Domain 2 to a memory device 744.

Power Domain 3 (734) is a collection of logic blocks which all operate at 0.8V and the power domain is therefore connected to a power rail 746 at 0.8V. Power Domain 3 can be powered on or off depending upon the particular power mode that is being employed. Therefore, Power Domain 3 can be at either 0.8V or 0V. In this example, a power switch is used to power off or on the power domain.

Power Domain 3 is also associated with appropriate isolation logic 748 to ensure that inadvertent and unintended data is not propagated to other blocks when the power domain is powered down.

Voltage level shifters are used to interact with other blocks that operate at other voltage levels. For example, since Power Domain 2 operates at 1.2V and Power Domain 3 operates at 0.8V, voltage level shifters (749, 750) are used between these two power domains.

The Appendix, which is expressly incorporated herein by this reference, sets forth commands, such as those in FIG. 6, and related options used in a common power format for example, in accordance with embodiments of the invention to provide power-related information at RTL. In particular, referring to FIGS. 3 and 7, the commands of the Appendix can be used to specify isolation, state retention, level shifting, always-on and power-switching in relation to power domains using an RTL data structure

2. Updating Restorable Registers after Power ShutOff

Power ShutOff (PSO) is a technique normally used to reduce power consumption of a design by turning off the voltage supply to parts of the design. A common approach to modeling designs under PSO conditions is to corrupt the values of registers and variables in the design blocks that are being powered down. The modeling and simulation of this behavior is essential to enabling the design and verification process. Existing HDLs have difficulties modeling this behavior because of the lack of basic language constructs that reflect this behavior. For instance, in Verilog, the "Initial Block" construct is intended to model the startup conditions and processing in a design i.e. at time equal zero. PSO, on the other hand, could be repeated many times during normal design operation. This highlights the need for another type of initial block; one that will only be activated when the voltage is restored to a design block.

Low power design modeling also requires a tighter coupling between the modeled behavior and the behavior of real hardware. This is illustrated in the typical latch recognition problem when combinational logic is modeled in the HDL using sequential logic constructs (e.g., as a combinational register). In general, combinational registers model hardware that updates when any dependency changes. However, conventional simulation tools generally do not distinguish between real sequential and combinational registers so that these registers both behave in the same manner. With PSO, for example, combinational registers should behave differently when power is restored after a shutoff. Combinational registers should be immediately updated with the latest values of their driver, whereas sequential registers should wait for their enabling condition to become true before updating their values. Not recognizing this difference can result in simulation errors and possible catastrophic failures.

Constant corruption (e.g., for a constant register) is another potential problem. It is customary for a designer to use a small subset of variables as constants whose values do not change during simulation. Typically these variables or registers are corrupted in response to a power shutoff. Since the initialization of these constants happens only at the beginning of simulation, these constants would lose their values after a PSO shutdown. They would remain stuck with their corrupted values which could result in simulation failures or erroneous results.

Accordingly, some embodiments of the present invention provide a solution to problems described above through a pre-simulation analysis of the HDL code. The analysis recognizes the constructs that require special handling when performing low power simulation with PSO. The embodiments implement in a simulation tool, the runtime routines that realizes this simulation behavior seamlessly. As a byproduct of this, constructs in the user code that result in an ambiguous HDL behavior can be identified and corresponding warning messages can be generated. For example, a user attempt to specify a combinational register as a state retention device will yield a warning message in some operational settings.

Then, by first identifying the combinational and constant registers, appropriate mechanisms are thereby enabled that allow the implementation of the correct behavior in the simulation engine. These include the following:

Before PSO, the values of constant registers and variables are retrieved from the simulation database and saved in memory. When power is restored the constants are reset to their pre-powerdown values.

Similarly combinational register values are also saved prior to a power shutdown. However, in this case, the values could change as register drivers could exist in another design block whose power has not been shutoff In this case, we establish a change of value callback routine that monitors the values of these register. When the drivers of a special register attempts to change its value, the new value will replace the old saved value. Accordingly, the saved value always reflects the latest value that the special register or variable should get when power is restored.

An embodiment of the present invention illustrates aspects of this approach. In the following Verilog code, register Areg is a combinational register since its value is updated whenever the value of Input_1 changes.

always @ (Input_1)
Areg =Input_1;

Let us assume Input_1 is a input port pin of the design block being powered down. When power to the block is shutdown, the value of Areg will be corrupted. This is typically done by forcing its value to the unknown value (X). When power is restored, the value of Areg could remain corrupted if Input_1 does not change to force an evaluation of the assignment statement.

When a simulator enhanced with in accordance with an embodiment of our invention is used, Areg is recognized as a special combinational register. Upon power up its value is restored to the latest value of Input_1. This is the correct equivalent behavior.

Corresponding VHDL code that shows a combinational latch that results from a fully specified If statement is also listed below:

Process (Input_1)
If (Input_1 ='1') then
Areg <=Input_1;
Else
Areg <='0';
End if;
End Process;

In this case too, a recognition analysis in accordance with an embodiment of the invention will identify Areg as a combinational register that requires special pre and post PSO processing. Areg will be updated following powerup with the appropriate value.

Figure 8:
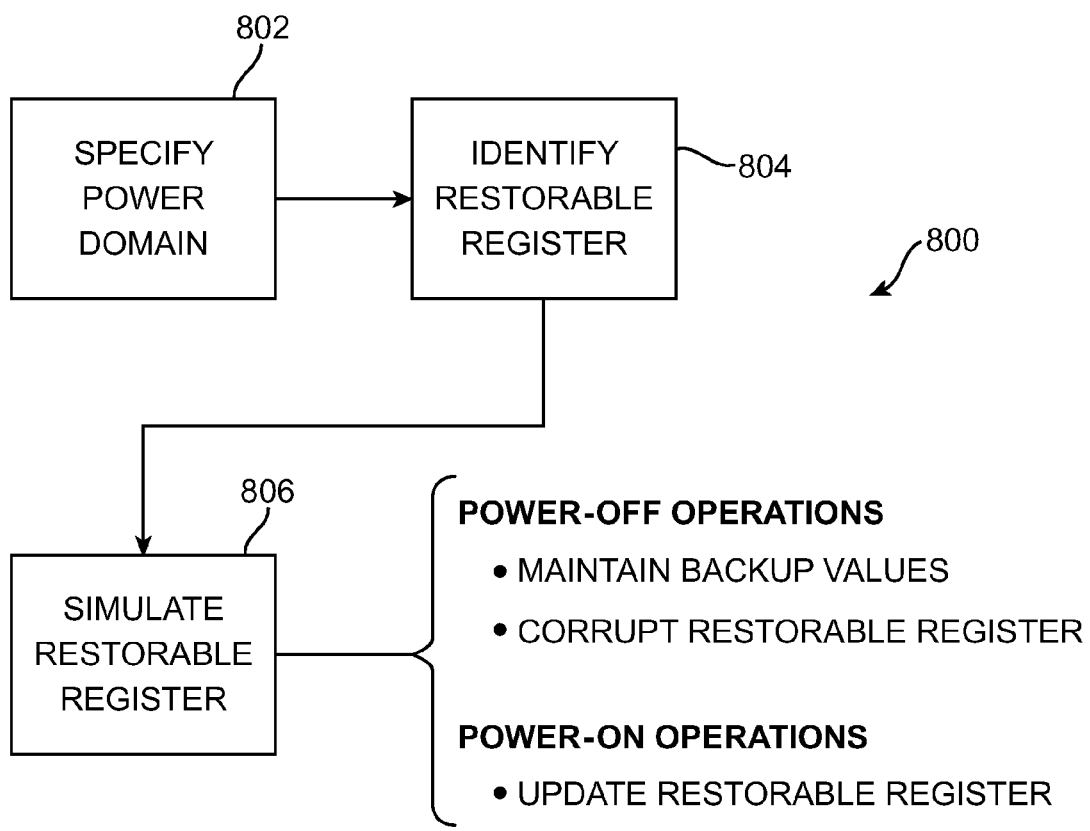
FIG. 8 shows an exemplary method for simulating a restorable register according to an embodiment of the present invention.

Combinational registers and constant registers can be considered as specific examples of restorable registers that require updating after Power Shutoff in a power domain analysis. FIG. 8 shows a method 800 of simulating a restorable register in a power domain of an RTL design according to an embodiment of the present invention. First the power domain is specified in the RTL design 802. In general, the power domain includes one or more registers and is configured to change power levels separately from other portions of the RTL design. Next at least one restorable registers is identified in the power domain 804, where the restorable register requires updating during power-on operations in the power domain. Next the restorable register is simulated in a power cycle 806, including power-off operations and power-on operations.

The power-off operations typically include maintaining one or more backup values during a power-off operation for updating the restorable register after the power-off operation. These back-up values may be shadow values for the restorable register or for related inputs depending on the operational setting. Also, depending on the operational setting, the power-off operations may include corrupting the restorable register (e.g., setting the register value to a spurious value "X"). Further, this corruption may be randomized to further reflect the operational setting.

The power-on operations (e.g., as an initialization or after power-off operations) typically include updating the restorable register during a power-on operation after the power-off operation by using the one or more backup values.

Figure 11:
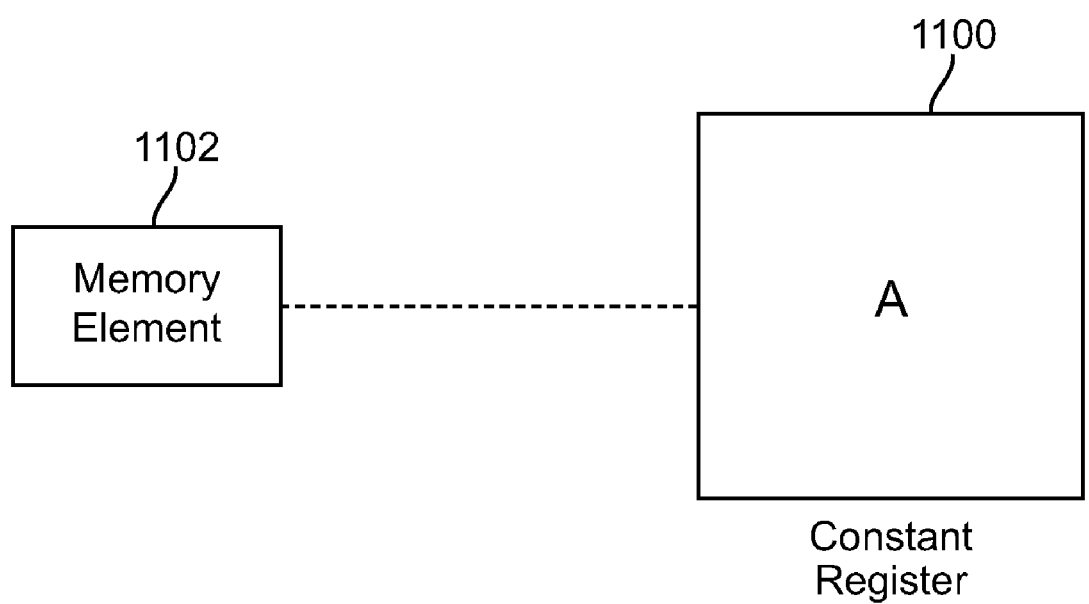
FIG. 11 shows an exemplary constant register in relation to the embodiment shown in FIG. 8.

Further details may relate to the nature of the restorable register. For example, FIG. 9 shows a combinational register 900 that depends on primary inputs to the power domain (e.g., external inputs) and FIG. 11 shows a constant register 1100, either of which may be considered as a restorable register because of the need for updating during power-on operations.

Figure 9:
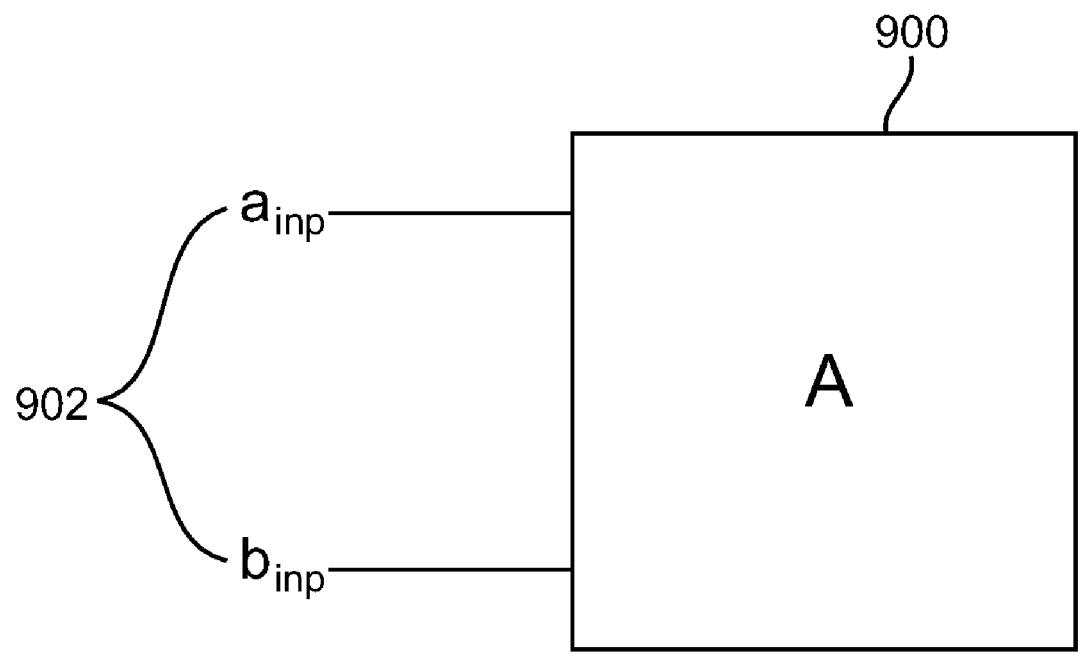
FIG. 9 shows an exemplary combinational register in relation to the embodiment shown in FIG. 8.

In FIG. 9 the combinational register A models hardware that updates during power-on operations. Register A 900 depends directly on primary inputs $a_{inp}$ and $b_{inp}$ 902 and holds the corresponding exclusive-or value $A=a_{inp} \hat{\ } b_{inp}$. The primary inputs 902 are active when the power domain is turned on and don't contain corrupted values, and so register A must be updated when simulating power-on operations.

The combinational register 900 can be represented by the following Verilog code for register variable A, where A depends on primary inputs $a_{inp}$ and $b_{inp}$ (e.g., representing $a_{inp}$ and $b_{inp}$ in the above example):

reg A;
always @(ainp or binp)
A =ainp^binp; //^ is the exclusive or operation.

In the physical device being simulated, the primary inputs, $a_{inp}$ and $b_{inp}$, represent wire inputs that are active when the power domain is powered on and the value of the combinational register A 900 is similarly active. Therefore, the simulation 806 reflects this by updating A during power-on operations.

Figure 10:
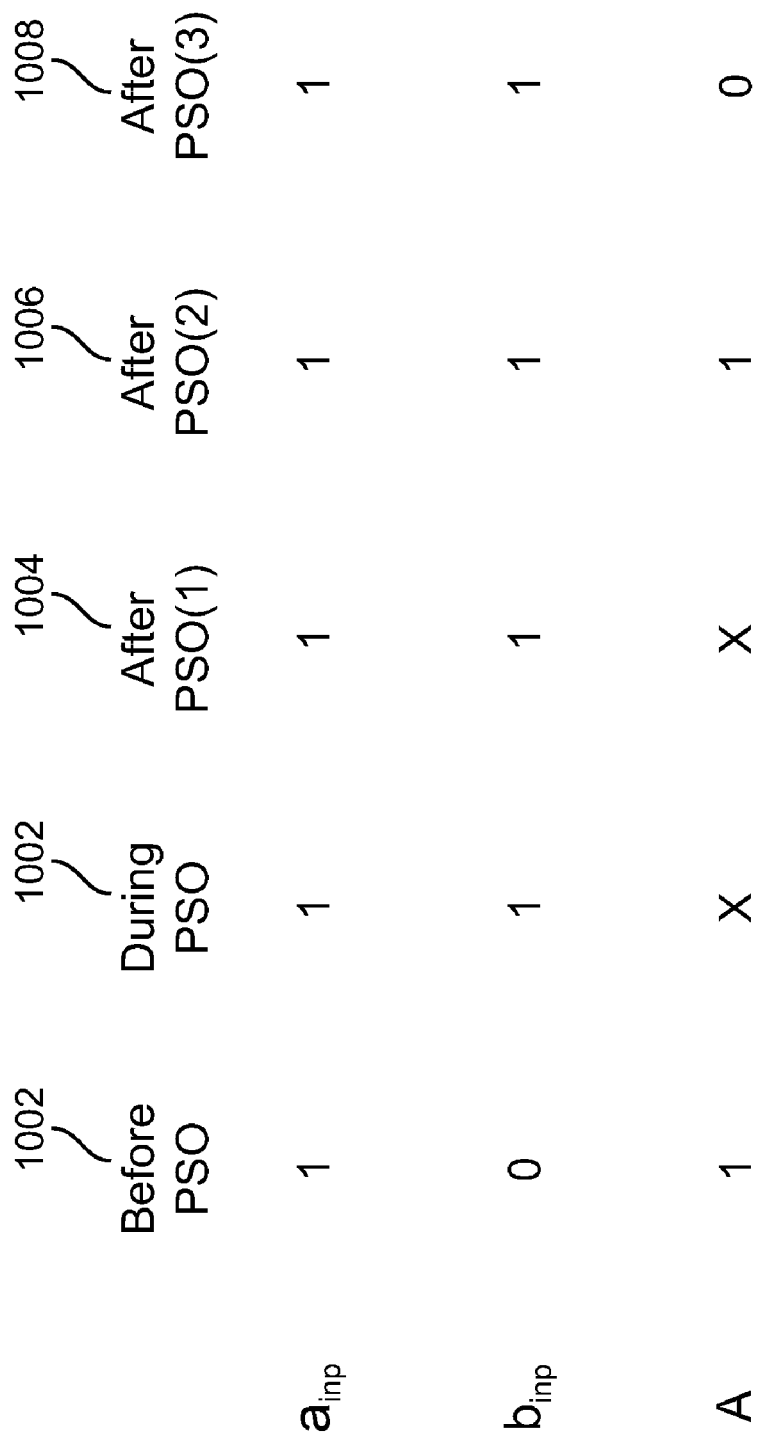
FIG. 10 shows an exemplary simulation of power the combinational register shown in FIG. 9.

FIG. 10 shows a table of values that illustrate the potential problems for accurate simulation in this context. Before PSO (power shut off) the values of $a_{inp}$, $b_{inp}$, and A are 1, 0 and 1 respectively 1002 so that the values are consistent with the above (exclusive-or) definition. When the power is turned off, the value of A is corrupted by assigning to it the unknown value X and the value of $b_{inp}$ changes 1002. When the power is restored, two distinct problems can arise in a corresponding simulation.

First, the value of A may be stuck at the corrupted value X 1004. If the values of $a_{inp}$, $b_{inp}$ do not change after power up, the "always" statement sensitivity in the above Verlog code never triggers. Then the assignment statement never executes and the value of A is stuck at X. This example may be considered as a typical Verilog simulation.

Secondly, if the value of A was saved prior to shutdown and then used to restore the register during power-on operations, then an incorrect value may be given to A since the current values of the primary inputs are not taken into account 1004. This example may be considered as a Verilog simulation where A is incorrectly treated as a state retention variable.

Finally, when A is updated after PSO in accordance with the above-described method 800, the correct value is saved (A=0) because the current values of the primary inputs have been taken into account 1008. Typically the primary inputs 902 are monitored for changes (e.g., in wire voltages), and when changes are detected backup values are saved (e.g, shadow values of the primary inputs 902 or the register 900).

FIG. 11 shows an alternative case where the restorable register is a constant register 1100 whose value is maintained as a backup value in a memory element 1102. Then, analogously to the above-described example for a combinational register 900, the constant register 1100 may be corrupted during PSO (e.g., A=X), and the constant register 1100 must be updated during power-on operations by retrieving the value from the memory element 1102.

So long as the RTL design representation (or corresponding supplementary design information) includes sufficient characterizations for combinational registers that depend on primary inputs and constant registers, the identification step 804 can be carried out by examining the design. This identification step 804 to identify the one or more relevant restorable registers typically includes identifying combinational registers (e.g., that model combinational logic), and evaluating dependencies for the registers to determine which registers depend directly on one or more primary inputs and require updating during power-on operations and which registers hold constant values and require updating during power-on operations.

At least some values based on the results of the method can be saved for subsequent use. For example the identified restorable registers and simulated values 1008 can be saved directly. Alternatively, some derivative or summary form of the results (e.g., averages etc.) can be saved for later use according to the requirements of the operational setting.

3. Additional Embodiments

Additional embodiments relate to an apparatus for carrying out any one of the above-described methods, where the apparatus includes a computer for executing computer instructions related to the method. In this context the computer may be a general-purpose computer including, for example, a processor, memory, storage, and input/output devices (e.g., monitor, keyboard, disk drive, Internet connection, etc.). However, the computer may include circuitry or other specialized hardware for carrying out some or all aspects of the method. In some operational settings, the apparatus may be configured as a system that includes one or more units, each of which is configured to carry out some aspects of the method either in software, in hardware or in some combination thereof.

At least some values based on the results of the method can be saved, either in memory (e.g., RAM (Random Access Memory)) or permanent storage (e.g., a hard-disk system) for later use. For example the identified restorable registers and simulation results can be saved directly for application in power domain design.

Additional embodiments also relate to a computer-readable medium that stores (e.g., tangibly embodies) a computer program for carrying out any one of the above-described methods by means of a computer. The computer program may be written, for example, in a general-purpose programming language (e.g., C, C++) or some specialized application-specific language. The computer program may be stored as an encoded file in some useful format (e.g., binary, ASCII).

Although only certain exemplary embodiments of this invention have been described in detail above, those skilled in the art will readily appreciate that many modifications are possible in the exemplary embodiments without materially departing from the novel teachings and advantages of this invention. For example, aspects of embodiments disclosed above can be combined in other combinations to form additional embodiments. Accordingly, all such modifications are intended to be included within the scope of this invention.

4. Appendix Power Related Commands and Options

This Appendix illustrates commands and options for characterizing power domains according to an embodiment of the present invention.

The create_isolation_logic command is used to add isolation cells for certain designer-specified power domains. This command allows a designer to specify which pins are to be isolated by 1) specifying all pins to be isolated with the -pins option; 2) selecting only output pins in the power domains listed with the -from option; 3) selecting only input pins in the power domains listed with the -to option; and 4) combining options to filter the set of pins. Specifically, a designer may 1) combine -pins and -from options to isolate those pins in the designer-specified list that are also output pins in a power domain listed with the -from option; 2) combine -pins and -to options to isolate those pins in the designer-specified list that are also input pins in a power domain listed with the -to option; 3) combine -from and -to options to isolate input pins that belong to a power domain listed with the -to option but that are also driven by a net coming from a power domain listed with the -from option; 4) combine -pins, -from and -to options to isolate those input pins in the designer-specified list that belong to a power domain listed with the -to option but that are also driven by a net coming from a power domain listed with the -from option; and 5) exclude certain pins with the -exclude option. An example use of the create_isolation_logic command is shown below:

create_isolation logic
    -isolation_condition expression
    {-pins pin_list | -from power_domain_list | -to power_domain_list} . . .
    [-exclude pin_list] [-location {from | to}]
    [-isolation_output {high|low|hold}]
    [-cells cell_list] [-prefix string]

The options and their corresponding arguments of the create_isolation_logic command are shown as follows:

-cells cell_list: This option and its argument specify the names of the library cells that are used as isolation cells for the selected pins. By default, the appropriate isolation cells are chosen from the isolation cells defined with the define_isolation_cell command or from the library cells with isolation related .lib attributes.

-exclude pin_list: This option and its argument specify a list of pins that do not require isolation logic.

-from power_domain_list: This option and its argument limit the pins to be considered for isolation to output pins in the specified power domains. If specified with -to option, all input pins in the -to domains that are receiving signals from the -from domains will be isolated. The power domains are previously defined with the create power domain command.

-isolation_condition expression: This option and its argument specify a condition when the specified pins should be isolated. This condition is a function of pins.

-isolation_output {high|low|hold}: This option and its argument control and generate the output value at the output of the isolation logic in response to certain isolation condition being met. The output can be high, low, or held to the value it has right before the isolation condition is activated.

-location {from|to}: This option and its argument specify the power domain to which the isolation logic is added. The from argument stores the isolation logic with the instances of the originating power domain, and the to argument stores the isolation logic with the instances of the destination power domain. The default argument is to.

-pins pin_list: This option and its argument specify a list of pins to be isolated. The designer may list input pins and output pins of power domains. The designer may further limit the pins to be isolated using the -from, -to, and -exclude options.

-prefix string: This option and argument specify the prefix to be used when creating the create_isolation_logic.

-to power_domain_list: This option and its argument limit the pins to be considered for isolation to input pins in the specified power domains. The power domains are previously defined with the create_power_domain command.

The create_level_shifter_rule command is used to add rules for adding level shifters. This command allows to specify on which pins to insert level shifters. This command allows designers to 1) specify all pins on which to insert level shifters with the -pins option; 2) select only output pins in the power domains listed with the -from option; 3) select only input pins in the power domains listed with the -to option; 4) combine options to filter the set of pins: 4a) combine -pins and -from options—only adds level shifters to those pins in the specified list that are also output pins in a power domain listed with the -from option; 4b) combine -pins and -to options only adds level shifters to those pins in the specified list that are also input pins in a power domain listed with the -to option; 4c) combine -from and -to options—only adds level shifters to input pins that belong to a power domain listed with the -to option but that are also driven by a net coming from a power domain listed with the -from option; 4d) combine -pins, -from and -to options—only adds level shifters to those input pins in the specified list that belong to a power domain listed with the -to option but that are also driven by a net coming from a power domain listed with the -from option; 5) exclude specific pins through the -exclude option.

The create_level_shifter_rule command is illustrated below:

create_level_shifter_rule
    -name string
    {-pins pin_list | -from power_domain_list | -to power_domain_list} . . .
    [-exclude pin_list] [-location {from | to}]
    [-cells cell_list] [-prefix string]

Options for the create_level_shifter_rule command are listed below:

-cell_list: This option and its argument specify the names of the library cells to be used to bridge the specified power domains. By default, the appropriate level shifter cells are chosen from the level shifter cells defined with the define_level_shifter_cell command or from the library cells with level-shifter related .lib attributes.

-pin_list: This option specifies a list of pins that do not require level shifters.

-power_domain_list: This option specifies the name of the originating (driving) power domains. The power domain must have been previously defined with the create_power_domain command.

-location {from | to}: This option specifies where the level shifters must be stored: from stores the level shifters with the instances of the originating power domain; to stores the level shifters with the instances of the destination power domain; Default: to -name string: This option specifies the name of the level shifter rule. Note: The specified string cannot contain wildcards.

-pins pin_list: This option specifies a list of pins to be isolated. You can list input pins and output pins of power domains. You can further limit the pins to be isolated using the -from, -to, and -exclude options.

The create_mode_transition command defines how the transition between two power modes is controlled:

create_mode_transition
    -name string
    -from_mode power_mode -to _mode power_mode
    -start_condition expression [-end_condition expression]
    [-clock_pin clock_pin [-cycles number | -latency float]]

Options for the create_mode_transition command are listed below:

-clock_pin clock_pin: This option specifies the name of the clock pin that controls the transition.

-end_condition expression: This option specifies the condition that acknowledges when the power mode transition is finished.

-cycles number: This option specifies an integer of number of clock cycles needed to complete the power transition mode.

-from_mode (-to_mode) power_mode: This option specifies the power mode from (to) which to transition. The mode must have been previously defined with the create_power_mode.

-latency float: This option specifies the time it takes to transition. Specify the time in the units specified by the set_time_unit command.

-name string: This option specifies the name of the power mode transition.

-start_condition expression: This option specifies the condition that triggers the power mode transition.

The create_power_domain command creates a power domain and specifies the instances and top-level ports that belong to this power domain. By default, an instance inherits the power domain setting from its parent hierarchical instance or design, unless that instance is associated with a specific power domain. In one power format, referred to as the CPF, power domains are associated with the design objects based on the logical hierarchy. The order in which a designer creates the power domains is irrelevant. Note that a designer can define at least two power domains for a design, and only one power domain can be the default power domain. In addition, the create_power_domain command specifies the -power_switchable_nets and -ground_switchable_nets options if the designer wants to use the CPF file as a golden constraint file throughout the entire flow from design creation until design implementation and signoff. An example use of the create_power_domain command is shown below:

```
create_power_domain
-name power_domain
{-default [-instances instance_list]
|-instances instance_list [-boundary_ports pin_list]
|-boundary_ports pin_list
[-power_switchable_nets    net_list    -ground_switchable_nets net_list]
[-shutoff_condition expression]
```

The options and their corresponding arguments of the create_power_domain command are shown as follows:

-boundary_ports pin_list: This option and its argument specify the list inputs and outputs that are considered part of this domain. Specifically, for inputs and outputs of the top-level design, it specifies ports. For inputs and outputs of instances of a timing model in the library, it specifies a list of the instance pins that are part of the domain. If this option is not specified with the -instances option, the power domain is considered to be a virtual power domain. A virtual domain allows a designer to describe the associations of the inputs and outputs of an existing instance block or a not-yet designed instance block with power domains.

-default: This option identifies the specified domain as the default power domain. All instances of the design that are not associated with a specific power domain belong to the default power domain. This is also the power domain that is referenced when information for calculating delays of a specific condition of a design is created.

-instances instance_list: This option and its argument specify the names of all instances that belong to the specified power domain. If this option is specified together with the -io_ports option, it indicates that for any connection between a specified port and any instance inside the power domain, no special interface logic for power management is required.

-name power_domain: This option and its argument specify a name of a power domain.

-shutoff_condition expression: This option and its argument specify a condition when a power domain is shut off. The condition is a Boolean function of the pins. In the default mode, the power domain is on.

The example below illustrates the uses of the create_power_domain command. It assumes a design with the hierarchy Top->INST1->INST2. In this example, the following two sets of CPF commands are equivalent:

a. create_power_domain -name PD1 -instances INST1
create_power_domain    -name    PD2    -instances INST.INST2 b. create_power_domain    -name    PD2    -instances INST1.I.INST2
create_power_domain -name PD1 -instances INST1

This illustrates that the order in which the designer specifies the target domains is irrelevant. The result is that instance INST1 belongs to power domain PD1 and instance INST2 belongs to power domain PD2. The following command associates a list of instances with power domain PD2:

create_power_domain -name PD2 -instances {A C I_ARM1 PAD 1}

The create_state_retention_logic command is used to replace selected registers or all registers in the specified power domain with state retention flip_flops. By default, the appropriate state retention cells are chosen from the state retention cells defined with the define state_retention_cell command or from the library based on the appropriate .lib attributes. An example use of the create_state retention_logic command is shown below.

```
create_state_retention_logic
{ -power_domain power_domain | -instances instance_list
-restore_edge expression [ -save_edge expression]
[ -clock_gating_condition expression]
[ -cell_type string]
```

The options and their corresponding arguments of the create_state_retention_logic command are shown as follows:

-cell_type string: This option and its argument specify the class of library cells that can be used to map designer-specified sequential elements such as flip-flops and latches. The specified string corresponds to the value of a power_gating_cell .lib attribute. If this option is not specified, the tool may automatically choose the state retention flip-flops from the library.

-clock_gating_condition expression: This option and its argument specify a condition when the clock of a state retention cell is gated so that the save or restore operation can be carried out. The condition is a function of the pins. Note that some technologies require the clock signal being stable before a save or restore operation can be carried out.

-instances instance_list: This option and its argument specify the names of the latches and flip_flops that a designer wants to replace with a state retention flip-flop. A designer may specify the names of the leaf instances. If the designer specifies the name of a hierarchical instance, all latches and flip-flops in this instance and its children that belong to the same power domain will be replaced. Note that the instances may belong to several power domains. If they belong to different power domains, the same conditions will be applied.

-power_domain power_domain: This option and its argument specify a name of a power domain containing the target flip_flops to be replaced. In this case, all flip-flops in this power domain are replaced. The power domain is previously defined with the create_power_domain command.

-restore_edge expression: This option and its argument specify a condition when the states of the sequential elements need to be restored. The expression is a function of pins. When the expression changes from false to true, the states are restored. During logical synthesis, the logic implementing the expression will be used to drive the restore pin of the state retention cells.

-save_edge expression: This option and its argument specify a condition when the states of the sequential elements need to be saved. The condition is a function of pins. When the expression changes from false to true, the states are saved. During logical synthesis, the logic implementing the expression will be used to drive the save pin of the state retention cells. The inverse of this option is the restore_edge option.

The set_array_naming_style command specifies a format for naming individual bits of instance arrays. Note that this command appears once in a CPF file. Also note that this command is not needed if the designer uses the same object names in CPF as in the design. This command is optional in a CPF file used by RTL compiler. If the designer wants to include the command in the CPF file used by RTL compiler, the specified string needs to match the value of the hdl_array_naming_style root attribute set in RTL compiler. If the CPF file is generated by RTL compiler, the string in this command will match the value of the hdl_array_naming_style root attribute in RTL compiler. An example use of the set_array_naming_style command is shown below. The string specifies the format for an individual bit of an instance array:

set_array_naming_style string

The set_hierarchy_separator command specifies the hierarchy delimiter character used in the CPF file. Note that this command appears once in the CPF file. The Character argument specifies the hierarchy delimiter character. An example use of the set_hierarchy_separator command is shown below:

set_hierarchy_separator character

The set_cpf_version command specifies the version of the format. The value argument specifies the version by using a string. An example use of the set_cpf_version command is shown below.

set_cpf_version 1.0

The set_register_naming_style command specifies the format used to print out flip-flops and latches in the netlist. Note that this command appears once in a CPF file. Also note that this command is not needed if the same object names in CPF as in the design are used. This command is optional in a CPF file used by RTL compiler. If a designer wants to include the command in the CPF file used by RTL compiler, he needs to ensure that the specified string matches the value of the hdl_reg_naming_style root attribute set in RTL compiler. If the CPF file is generated by RTL compiler, the string in this command will match the value of the hdl_reg_naming_style root attribute in RTL compiler. An example use of the set_register_naming_style is shown below. The string argument specifies the format used for flip_flops and latches in the netlist as shown below:

set_register_naming_style string

The set_scope command changes the current scope to the scope determined by the argument. Note that all objects referred to in the library cell-related CPF commands are scope insensitive, all design objects except for ground and power nets are scope sensitive, and all the expressions in the CPF design-related constraints are scope sensitive. An example use of the set_scope command is shown below:

set_scope {hier_instance [ -merge_default_domains]| -top | -up}

The options and their corresponding arguments of the set_scope command are shown as follows:

-top: This option changes the scope to the top design. Note that when a hierarchical CPF file is used, the designer should avoid using this argument in a sourced CPF file. In this case, the command does not reset the scope to the scope of the module of the hierarchical instance to which the sourced CPF file applies, but to the design of the main CPF file.

-up: This option changes the scope to the immediate parent of the current scope. Note that if a designer uses this argument when the current scope is already the top design, an error message may be issued.

-hier_instance: This option changes the scope to the specified hierarchical instance. The instance is a valid hierarchical instance in the current scope.

-merge_default_domains: This option specifies whether to merge the default power domain of the current scope (when it is not the top design) with the default power domain of the top design. Note that this option may be specified in the context of hierarchical CPF.

The following example further illustrates the use of the set_scope command.

set_top_design A
    set_scope B.C; #changes the scope to B.C
    create_isolation_logic -isolation_condition .enable -from PD1
    # the previous command ues the enable signal at the top level to create isolation
    # logic at the output ports of power domain PD1
    set_scope -up ; #changes the scope to B
    set_scope -up ; #changes the scope to the parent of B, which is A or the top The set_top_design command specifies the name of the design to which the power information in the CPF file applies. Note that this command usually appears once in a CPF file. If it appears multiple times, the first one applies to the top design, while the subsequent ones follow a scope change using the set_scope command. An example use of the set_top_design command is shown below.

set_top_design design

The argument design specifies the name of the design to which the power information in the CPF file applies. It specifies the name of the top module in RTL. Note that when a designer uses a hierarchical CPF file, the design name corresponds to the module name of the current scope.

The following example further illustrates the use of the set_top_design command. In this case, the commands of the CPF file of the soft block are copied directly into the CPF file of the top design. Design B corresponds to the module name of instance i_B, which is the current scope.

set_top_design top_chip
    create_power domain -name PD1 -instances C
    create_power_domain -name Default -default
    set_scope i_B
    set_top_design B
    create_power_domain -name Standby -instances DRAM -io_ports {P1 P2} \
    -shutoff_condition power_down
    set_scope -top
    create_isolation_logic-fromi_B.Standby-toPD1-isolation_conditionstdby_signal For applications that read .lib files define_isolation_cell identifies the library cells in the .lib files that can be used as isolation cells. Note: If the library contains cells that have the attribute is_isolation_cell set to true, an application might use these cells before it uses the cells identified with an define isolation cell command. For applications that do not read library files define_isolation_cell allows to identify the instances of isolation cells in the netlist.

define_isolation_cell
    -cells cell_list [-library_set library_set]
    [-always_on_pin pin_list]
    [{-power_switchable LEF_power_pin | -ground_switchable LEF_ground_pin}-power LEF_power_pin -ground LEF_ground_pin]
    [-valid_location { from | to}]
    [-non_dedicated]
    -enable pin The options for the define_isolation_cell command are outlined below:

-always_on_pins pin_list: This option specifies a list of cell pins which must always be driven. Note: A pin specified with this option, can be specified with other options as well.

-cells cell_list: This option identifies the specified cells as isolation cells. Note: This is equivalent to setting the attribute is_isolation_cell to true in the Liberty library. The libraries loaded will be searched and all cells found will be identified.

-enable pin: This option identifies the specified cell pin as the enable pin.

-ground LEF_ground_pin: If this option is specified with the -power_switchable option, it indicates the GROUND pin of the specified cell. If this option is specified with the -ground_switchable option, it indicates the GROUND pin in the corresponding LEF cell to which the ground that is on during power shut-off mode is applied.

-ground_switchable LEF_power_pin: Identifies the GROUND pin in the corresponding LEF cell to which the ground that is turned off during power shut-off mode is applied. One can only specify this option when you cut off the path from power to ground on the ground side (that is, use a footer cell).

-library_set library_set: References the library set to be used to search for the specified cells. Specify the library set name. The libraries must have been previously defined in a define_library_set command.

-non_dedicated: Allows to use specified cells as normal function cells.

-power_LEF_power_pin: If this option is specified with the -ground switchable option, it indicates the POWER pin of the specified cell. If this option is specified with the -power_switchable option, it indicates the POWER pin in the corresponding LEF cell to which the power that is on during power shut-off mode is applied.

-power_switchable LEF_power_pin: Identifies the POWER pin in the corresponding LEF cell to which the power that is turned off during power shut-off mode is applied.

One can only specify this option when you cut off the path from power to ground on the power side (that is, use a header cell).

-valid_location { from | to}: Specifies the location of the isolation cell. Possible values are from—indicating that the cell must be stored with the source power domain to—indicating that the cell must be stored with the destination power domain.

For applications that read .lib files define_level_shifter_cell identifies the library cells in the .lib files that can be used as level shifter cells. Note: if the library contains cells that have the attribute is_level_shifter set to true, an application might use these cells before it uses the cells identified with an define_level_shifter_cell command. For applications that do not read library files define_level_shifter_cell allows to identify the instances of level shifter cells in the netlist.

```
define_level_shifter_cell
-cells cell_list [-library_set library_set]
[-always_on_pin pin_list]
-input_voltage_range {voltage | voltage_range}
-output_voltage_range {voltage | voltage_range}
[-direction {up|down|bidir}]
[-output_voltage_input_pin pin]
{ -input_power_pin LEF_power_pin [-output_power_pin LEF_power_pin]
|[-input_power_pin LEF_power_pin]-output_power_pin LEF_power_pin}
-ground LEF_ground_pin
[-valid_location {from | to}
```

The options for the files define_level_shifter_cell command are outlined below:

-always_on_pins pin_list: Specifies a list of cell pins which must always be driven. Note: A pin specified with this option, can be specified with other options as well.

-cells cell_list: Identifies the specified cell as a level shifter. Note: This is equivalent to setting the attribute is_level_shifter to true in the Liberty library. The libraries loaded will be searched and all cells found will be used.

-direction {up | down | bidir}: Specifies whether the level shifter can be used between a lower and higher voltage, or vice versa (Default: up).

-ground LEF_ground_pin: Identifies the name of the GROUND pin in the corresponding LEF cell.

-input_power_pin LEF_power_pin: Identifies the name of the POWER pin in the corresponding LEF cell that must be connected to the power net to which the voltage of the source power domain is applied.

-input_voltage_range {voltage | voltage_range}: Identifies either a single input voltage or a range for the input (source) voltage that can be handled by this level shifter. The voltage range must be specified as follows: lower_bound:upper_bound:step: Specify the lower bound, upper bound and voltage increment step, respectively.

-library_set library_set: References the library set to be used to search for the specified cells. Specify the library set name. The libraries must have been previously defined in a define_library_set command.

-output_power_pin LEF_power_pin: Identifies the name of the POWER pin in the corresponding LEF cell that must be connected to the power net to which the voltage of the destination power domain is applied.

-output_voltage_input_pin pin: Identifies the input pin that drives a gate inside the level shifter cell that is powered by the power supply connected to the pin identified by the -output_power_pin option. By default, the gates (inside the level shifter cell) driven by the input pins, are assumed to be powered by the power supply connected to the pin identified by the -input_power_pin option. Note: If the cell is also listed in the define isolation cell command, this pin is the enable pin of the isolation cell.

-output_voltage_range {voltage | voltage_range}: Identifies either a single output voltage or a range for the output (source) voltage that can be handled by this level shifter. The voltage range must be specified as follows: lower_bound: upper_bound:step (Specify the lower bound, upper bound and voltage increment step, respectively.)

-valid_location {from | to Specifies the location of the level shifter cell. Possible values are: from—indicating that the cell must be stored with the source power domain; to—indicating that the cell must be stored with the destination power domain. (Default: to)

For applications that read .lib files define_power_switch_cell identifies the library cells in the .lib files that can be used as power switch cells. For applications that do not read library files define_power_switch_cell_allows to identify the instances of power switch cells in the netlist. Note: This command is required if you use the create_power_switch_logic command.

```
define_power_switch_cell
-cells cell_list [-library_set library_set]
-stage_1_enable expression [-stage_1_output expression]
[-stage_2_enable expression [-stage_2_output expression]]
-type {footer|header}
[-power_switchable LEF_power_pin -power_LEF_power_pin
```

|-ground_switchable LEF_ground_pin -ground LEF_ground_pin]
[-on resistancefloat]
[-stage_1_saturation_current float] [-stage_2_saturation_current float]
[-leakage_current float]

The options for the create_power_switch_logic command are outlined below:

-cells cell_list: This option identifies the specified cells as power switch cells.

-ground LEF_ground_pin: This option identifies the input ground pin of the corresponding LEF cell. One can only specify this option when you cut off the path from power to ground on the ground side (that is, use a footer cell).

-ground_switchable LEF_ground_pin: This option identifies the output ground pin in the corresponding LEF cell that must be connected to a switchable ground net.

-leakage_current float: This option specifies the leakage current when the power switch is turned off. Specify the current in ampere (A).

-library_set library_set: This option references the library set to be used to search for the specified cells. Specify the library set name. The libraries must have been previously defined in a define_library_set command.

-on_resistance float: This option specifies the resistance of the power switch when the power switch is turned on. Specify the resistance in ohm.

-power LEF_power_pin: This option identifies the input POWER pin of the corresponding LEF cell. You can only specify this option when you cut off the path from power to ground on the power side (that is, use a header cell).

-power_switchable LEF_power_pin: This option identifies the output power pin in the corresponding LEF cell that must be connected to a switchable power net. One can only specify this option when you cut off the path from power to ground on the power side (that is, use a header cell).

-stage_1_saturation current (-stage_2_saturation_current) float: This option specifies the Id saturation current of the MOS transistor in the specified stage. Specify the current in ampere (A). The saturation current—which can be found in the SPICE model—limits the maximum current that a power switch can support.

-stage_1_enable (-stage_2_enable) expression: This option specifies when the transistor driven by this input pin is turned on (enabled) or off. The switch is turned on when the expression evaluates to true. The expression is a function of the input pin.

-stage_1_output (-stage_2_output) expression: This option specifies whether the output pin specified in the expression is the buffered or inverted output of the input pin specified through the corresponding -stage_x_enable option. The pin specified through the -acknowledge_receiver option of the create_power_switch rule command is connected to the output pin specified through: The -stage_1_output option if the -stage_2_output option is omitted; The -stage_2_output option if both -stage_1_output and stage_2_output options are specified. Note: If neither option is specified, the pin specified through the -acknowledge_receiver is left unconnected.

-type {header|footer}: This option specifies whether the power switch cell is a header or footer cell.

For applications that read .lib files define_state_retention_cell identifies the library cells in the .lib files that can be used as state retention cells. Note: If the library contains cells that have the attribute power_gating_cell set to true, an application might use these cells before it uses the cells identified with an define_state_retention_cell command. For applications that do not read library files define_state_retention_cell allows to identify the instances of state retention cells in the netlist. Note: This command is required for any application that does not read .lib files.

define_state_retention_cell
-cells cell_list [-library_set library_set]
[-always_on_pin pin_list]
[-clock_pin pin]
-restore_function expression [-restore_check expression]
[-save_function expression] [-save_check expression]
[{-power_switchable LEF_power_pin -ground_switchable LEF_ground_pin}-power LEF_power_pin -ground LEF_ground_pin]

The options for the define_state_retention_cell command are outlined below:

-always_on_pins pin_list: This option specifies a list of cell pins which must always be driven. Note: A pin specified with this option, can be specified with other options as well.

-cells cell_list: This option identifies the specified cells as state retention cells. Note: This is equivalent to setting the attribute power gating cell to true in the Liberty library. The libraries loaded will be searched and all cells found will be used.

-clock_pin pin: This option specifies the clock pin.

-ground LEF_ground pin: If this option is specified with the -power_switchable option, it specifies the GROUND pin of the corresponding LEF cell. If this option is specified with the -ground_switchable option, it indicates the GROUND pin in the corresponding LEF cell to which the ground net that is on during power shut-off mode is connected.

-ground_switchable LEF_power_pin: This option identifies the GROUND pin in the corresponding LEF cell to which the ground that is turned off during power shut-off mode is applied. One can only specify this option when you cut off the path from power to ground on the ground side (that is, use a footer cell).

-library_set library_set: This option references the library set to be used to search for the specified cells. Specify the library set name. The libraries must have been previously defined in a define library set command.

-power LEF_power_pin: If this option is specified with the -ground_switchable option, it indicates the POWER pin of the specified cell. If this option is specified with the -power_switchable option, it indicates the POWER pin to which the power that is always on during shut-off mode is applied.

-power_switchable LEF_power_pin: This option identifies the POWER pin in the corresponding LEF cell to which the power that is turned off during power shut-off mode is applied. One can only specify this option when you cut off the path from power to ground on the power side (that is, use a header cell).

-restore_check expression: This option pecifies the additional condition when the states of the sequential elements can be restored. The expression can be a function of the clock pin and the restore pin. The expression must be true when the restore event occurs. Note: If one wants to use the clock pin in the expression, you must have identified the clock pin with the -clock_pin option.

-restore_function expression: This option specifies the polarity of the restore pin that enables the retention cell to restore the saved value after exiting power shut-off mode. Note: Expression is limited to the pin name and the inversion of the pin name. An expression containing only the pin name indicates an active high polarity. An expression containing the inversion of the pin name indicates an active low polarity.

-save_check expression: This option specifies the additional condition when the states of the sequential elements can be saved. The expression can be a function of the clock pin and the save pin The expression must be true when the save event occurs.

Note: If one wants to use the clock pin in the expression, you must have identified the clock pin with the -clock pin option.

-save_function expression: This option specifies the polarity of the save pin that enables the retention cell to save the current value before entering power shut-off mode. If not specified, the save event is triggered by the opposite of the expression specified for the restore event. Note: Expression is limited to the pin name and the inversion of the pin name. An expression containing only the pin name indicates an active high polarity. An expression containing the inversion of the pin name indicates an active low polarity.

What is claimed is:

1. A method of simulating a restorable register in a power domain of an RTL (register transfer level) design, comprising:
specifying the power domain in the RTL design, wherein the power domain includes one or more registers and is configured to change power levels separately from other portions of the RTL design;
identifying the restorable register in the power domain, wherein the restorable register is updated during power-on operations in the power domain;
simulating the restorable register in a power cycle, wherein using a computer for simulating the restorable register includes operations for:
maintaining one or more backup values during a power-off operation for updating the restorable register after the power-off operation,
corrupting the restorable register during the power-off operation, and
updating the restorable register during a power-on operation after the power-off operation by using the one or more backup values; and
saving one or more values from the simulated restorable register.

2. A method according to claim 1, wherein
the restorable register is a combinational register that depends directly on one or more primary inputs for the power domain; and
maintaining the one or more backup values includes monitoring the one or more primary inputs for changing values.

3. A method according to claim 2, wherein
simulating the restorable register further includes operations for updating a shadow register for the restorable register in response to a change in the one or more primary inputs; and
updating the restorable register includes accessing the shadow register.

4. A method according to claim 1, wherein
the restorable register is a constant register whose value is maintained as a backup value in a memory element; and
updating the restorable register includes accessing the memory element.

5. A method according to claim 1, wherein identifying the restorable register in the power domain includes: identifying one or more combinational registers in the power domain and evaluating dependencies for the one or more combinational registers to determine which of the one or more combinational registers depend directly on one or more primary inputs and require updating during power-on operations.

6. A method according to claim 1, wherein identifying the restorable register in the power domain includes: evaluating dependencies for a plurality of registers in the power domain to determine which registers hold constant values and require updating during power-on operations.

7. A method according to claim 1, wherein the restorable register is updated as part of an initialization of the power domain during the power-on operation.

8. An apparatus for simulating a restorable register in a power domain of an RTL (register transfer level) design, the apparatus comprising a computer for executing computer instructions, wherein the computer includes computer instructions for:
specifying the power domain in the RTL design, wherein the power domain includes one or more registers and is configured to change power levels separately from other portions of the RTL design;
identifying the restorable register in the power domain, wherein the restorable register is updated during power-on operations in the power domain;
simulating the restorable register in a power cycle, wherein simulating the restorable register includes operations for:
maintaining one or more backup values during a power-off operation for updating the restorable register after the power-off operation,
corrupting the restorable register during the power-off operation, and
updating the restorable register during a power-on operation after the power-off operation by using the one or more backup values; and
saving one or more values from the simulated restorable register.

9. An apparatus according to claim 8, wherein
the restorable register is a combinational register that depends directly on one or more primary inputs for the power domain; and
maintaining the one or more backup values includes monitoring the one or more primary inputs for changing values.

10. An apparatus according to claim 9, wherein
simulating the restorable register further includes operations for updating a shadow register for the restorable register in response to a change in the one or more primary inputs; and
updating the restorable register includes accessing the shadow register.

11. An apparatus according to claim 8, wherein
the restorable register is a constant register whose value is maintained as a backup value in a memory element; and
updating the restorable register includes accessing the memory element.

12. An apparatus according to claim 8, wherein identifying the restorable register in the power domain includes: identifying one or more combinational registers in the power domain and evaluating dependencies for the one or more combinational registers to determine which of the one or more combinational registers depend directly on one or more primary inputs and require updating during power-on operations.

13. An apparatus according to claim 8, wherein identifying the restorable register in the power domain includes: evaluating dependencies for a plurality of registers in the power domain to determine which registers hold constant values and require updating during power-on operations.

14. An apparatus according to claim 8, wherein the restorable register is updated as part of an initialization of the power domain during the power-on operation.

15. An apparatus according to claim 8, wherein the computer includes a processor with memory for executing at least some of the computer instructions.

16. An apparatus according to claim 8, wherein the computer includes circuitry for executing at least some of the computer instructions.

17. A computer-readable medium that stores a computer program for simulating a restorable register in a power domain of an RTL (register transfer level) design, wherein the computer program includes instructions for:
 specifying the power domain in the RTL design, wherein the power domain includes one or more registers and is configured to change power levels separately from other portions of the RTL design;
 identifying the restorable register in the power domain, wherein the restorable register is updated during power-on operations in the power domain;
 simulating the restorable register in a power cycle, wherein simulating the restorable register includes operations for:
  maintaining one or more backup values during a power-off operation for updating the restorable register after the power-off operation,
  corrupting the restorable register during the power-off operation, and
  updating the restorable register during a power-on operation after the power-off operation by using the one or more backup values; and
 saving one or more values from the simulated restorable register.

18. A computer-readable medium according to claim 17, wherein
 the restorable register is a combinational register that depends directly on one or more primary inputs for the power domain; and
 maintaining the one or more backup values includes monitoring the one or more primary inputs for changing values.

19. A computer-readable medium according to claim 18, wherein
 simulating the restorable register further includes operations for updating a shadow register for the restorable register in response to a change in the one or more primary inputs; and
 updating the restorable register includes accessing the shadow register.

20. A computer-readable medium according to claim 17, wherein
 the restorable register is a constant register whose value is maintained as a backup value in a memory element; and
 updating the restorable register includes accessing the memory element.

21. A computer-readable medium according to claim 17, wherein identifying the restorable register in the power domain includes: identifying one or more combinational registers in the power domain and evaluating dependencies for the one or more combinational registers to determine which of the one or more combinational registers depend directly on one or more primary inputs and require updating during power-on operations.

22. A computer-readable medium according to claim 17, wherein identifying the restorable register in the power domain includes: evaluating dependencies for a plurality of registers in the power domain to determine which registers hold constant values and require updating during power-on operations.

23. A computer-readable medium according to claim 17, wherein the restorable register is updated as part of an initialization of the power domain during the power-on operation.

* * * * *